US008083300B2

(12) United States Patent
MaCall

(10) Patent No.: US 8,083,300 B2
(45) Date of Patent: Dec. 27, 2011

(54) ELECTRONICS ENCLOSURE FOR SUSPENDED CEILINGS

(75) Inventor: Thomas G. MaCall, San Jose, CA (US)

(73) Assignee: ADC Telecommunications, Inc., Eden Prairie, MN (US)

( * ) Notice: Subject to any disclaimer, the term of this patent is extended or adjusted under 35 U.S.C. 154(b) by 539 days.

(21) Appl. No.: 12/047,403

(22) Filed: Mar. 13, 2008

(65) Prior Publication Data

US 2009/0230827 A1 Sep. 17, 2009

(51) Int. Cl.
A47B 67/02 (2006.01)
(52) U.S. Cl. ...................................... 312/245; 312/223.1
(58) Field of Classification Search .................. 312/245, 312/223.1, 236, 327, 328, 10.1; 174/50; 220/3.3, 3.2, 3.5, 3.8, 3.7, 3.94; 296/37.8; 248/674, 675, 144
See application file for complete search history.

(56) References Cited

U.S. PATENT DOCUMENTS

| | | | | |
|---|---|---|---|---|
| 1,616,925 A * | 2/1927 | Riddell | .......................... | 396/504 |
| 2,989,206 A * | 6/1961 | McAfee | .......................... | 220/3.7 |
| 3,357,763 A * | 12/1967 | Toper | ............................ | 312/236 |
| 4,060,292 A | 11/1977 | Medina | | |
| 4,540,847 A * | 9/1985 | Gardner | ......................... | 174/491 |
| 4,686,381 A * | 8/1987 | Boteler et al. | ................. | 307/147 |
| 4,916,862 A * | 4/1990 | Storer | ............................ | 49/386 |
| 5,261,645 A * | 11/1993 | Huffman | ......................... | 254/267 |
| 5,407,261 A * | 4/1995 | Mercer | .......................... | 312/248 |
| 5,842,313 A * | 12/1998 | Murray et al. | ................ | 52/220.6 |
| 5,911,611 A * | 6/1999 | Saad | ............................... | 441/73 |
| 5,911,661 A | 6/1999 | Murray et al. | | |
| 5,954,410 A * | 9/1999 | Noellert | ......................... | 312/242 |
| 6,112,483 A * | 9/2000 | Murray et al. | ................ | 52/220.6 |
| 6,121,737 A * | 9/2000 | Guenther et al. | ............. | 318/266 |
| 6,349,029 B1 * | 2/2002 | Leman et al. | ............. | 361/679.57 |
| 6,449,917 B1 * | 9/2002 | Sullivan, III | ................ | 52/506.06 |
| 6,935,600 B1 * | 8/2005 | Barrepski | ...................... | 248/317 |
| 6,946,602 B1 * | 9/2005 | Gibbs et al. | .................... | 174/560 |
| 7,568,313 B1 * | 8/2009 | Matley | ............................ | 52/39 |
| 7,569,770 B2 * | 8/2009 | Remmert et al. | ............... | 174/50 |
| 7,795,533 B2 * | 9/2010 | Bravo et al. | ...................... | 174/50 |

OTHER PUBLICATIONS

"Ceiling Mount Enclosure (PGW-CM24-PP)", "http://www.e-vcp.com/images/PGW-CM24-PP.pdf accessed Feb. 8, 2008", Jan. 1, 2003, Publisher: Holocom Networks, Inc, Published in: Carlsbad, CA.

(Continued)

*Primary Examiner* — Janet M Wilkens
*Assistant Examiner* — Daniel Rohrhoff
(74) *Attorney, Agent, or Firm* — Fogg & Powers LLC

(57) ABSTRACT

An electronics enclosure is disclosed. The enclosure comprises a top plate and a cabinet frame, having at least two sides, coupled to the top plate. The enclosure further comprises a base plate pivotally coupled to the cabinet frame at an opposing end from the top plate, where the base plate has an upper surface and a lower surface and covers an opening in the cabinet frame. Moreover, at least one mounting plate is pivotally coupled inside the cabinet frame to hold at least one electronic component within the cabinet frame between the base plate and the top plate. The at least one mounting plate rotates from a first position wherein the at least one mounting plate is stored within the cabinet frame to a second position wherein the at least one mounting plate extends through the opening in the cabinet frame that is covered by the base plate.

15 Claims, 10 Drawing Sheets

OTHER PUBLICATIONS

"Model 1061.00 Suspended Ceiling Enclosures", "http://www.oberonwireless.com/WebDocs/Model1061-00_Spec_Sheet.pdf", Feb. 7, 2008, Publisher: Oberon Inc., Published in: State College, PA.

"SP-RCT Ceiling Tile Enclosure System", "http://www.sparcotech.com/SP-RCT-002.pdf", accessed Feb. 6, 2008, Publisher: Sparco Technologies Inc., Published in: San Antonio, TX.

"Terrawave Solutions Ceiling Tile Enclosures", "www.tessco.com", accessed Feb. 6, 2008, Publisher: Tessco Technologies, Published in: San Antonio, TS.

"Wapencl Wireless Access Point Ceiling Enclosure for Drop Ceilings", "www.wiremold.com", accessed Feb. 6, 2008, Jun. 2006, vol. ED133R1, Publisher: Wiremold, Published in: West Hartford, VA.

"XE-2200 Ceiling Mounted Enclosure", "www.xirrus.com" accessed Feb. 6, 2008, Publisher: Xirrus Inc., Published in: Westlake Village, CA.

\* cited by examiner

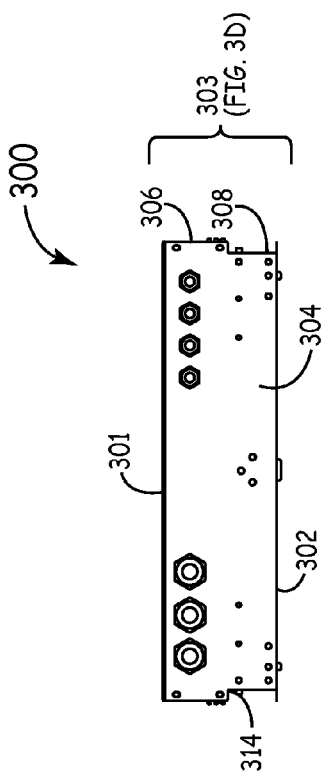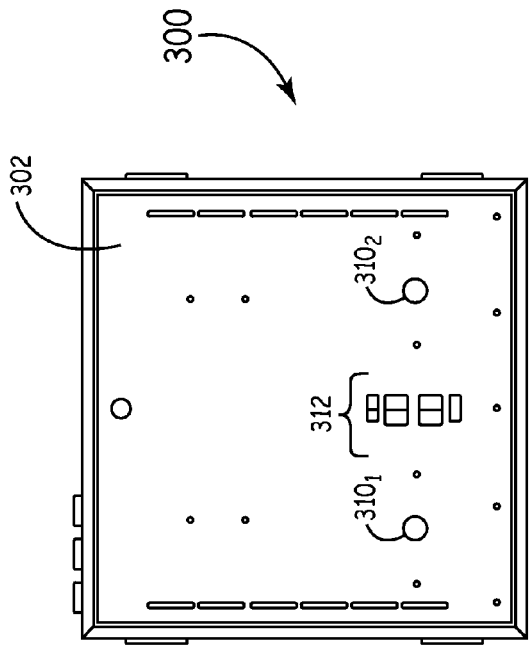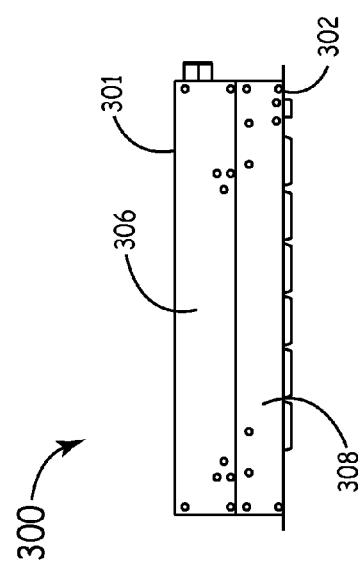

ELECTRONICS ENCLOSURE FOR SUSPENDED CEILINGS

BACKGROUND

In many indoor telecommunications and data networking installations, remote antenna units (RAUs) and other network components are installed above a suspended ceiling. To perform maintenance, the operator removes at least one ceiling tile to gain access to the components. Removal and re-installation of ceiling tiles is undesirable in many circumstances.

For example, system operators in hospitals and similar facilities are sensitive to the consequences of removal of ceiling tiles. When these tiles are removed, dust and other debris often fall onto the floor area below. As a result, many manufacturers have developed enclosures that are installed in place of a ceiling tile. The RAUs and other components are installed in the enclosure. Access to the components is typically provided by a door that is provided on the exposed surface of the enclosure.

Unfortunately, current attempts at providing enclosures that substitute for the at least one ceiling tile provide limited access to the RAUs and other network components. Furthermore, these enclosures typically are restricted to certain form factors or network component manufacturers.

For the reasons stated above and for other reasons stated below which will become apparent to those skilled in the art upon reading and understanding the present specification, there is a need in the art for improvements in electronics enclosures for suspended ceilings.

SUMMARY

An electronics enclosure is provided. The enclosure comprises a top plate and a cabinet frame, having at least two sides, coupled to the top plate. The enclosure further comprises a base plate pivotally coupled to the cabinet frame at an opposing end from the top plate, where the base plate has an upper surface and a lower surface and covers an opening in the cabinet frame. Moreover, at least one mounting plate is pivotally coupled inside the cabinet frame to hold at least one electronic component within the cabinet frame between the base plate and the top plate. The at least one mounting plate rotates from a first position wherein the at least one mounting plate is stored within the cabinet frame to a second position wherein the at least one mounting plate extends through the opening in the cabinet frame that is covered by the base plate.

BRIEF DESCRIPTION OF THE DRAWINGS

These and other features, aspects, and advantages are better understood with regard to the following description, appended claims, and accompanying drawings where:

FIGS. 3A and 3B are side elevational views of an embodiment of an electronics enclosure for suspended ceilings;

FIG. 3C is a plan view of one embodiment of a base plate for the electronics enclosure of FIGS. 3A and 3B;

Like reference characters denote like elements throughout the figures and text of the specification.

DETAILED DESCRIPTION

Embodiments disclosed herein relate to an electronics enclosure that allows for improved access (for example, easier installation and service or replacement) of telecommunications or similar networking components installed in the enclosure for placement in suspended ceilings. In at least one embodiment, the enclosure is designed to fit up to two remote antenna units (RAUs) for a wireless communications network, or one local area network (LAN) access point and one RAU. The enclosure comprises a cabinet frame suitable for mounting above the suspended ceiling to accommodate a plurality of electronic components. For example, the enclosure is mounted above a suspended ceiling, in place of one or more ceiling tiles, to allow easy access to the RAUs and the LAN access point. In one embodiment, the electronic components discussed here are mounted on pivotally hinged mounting plates to allow for ease of service and (potential) upgrades or replacement. Further, in one embodiment, a portion of the enclosure located above the suspended ceiling has at least one dimension that is larger than the corresponding dimension of the ceiling tile (for example, where the portion of the enclosure above the ceiling tile is wider than the ceiling tile). This enables housing of equipment that has a larger aggregate footprint than a standard ceiling tile.

Figure 1:
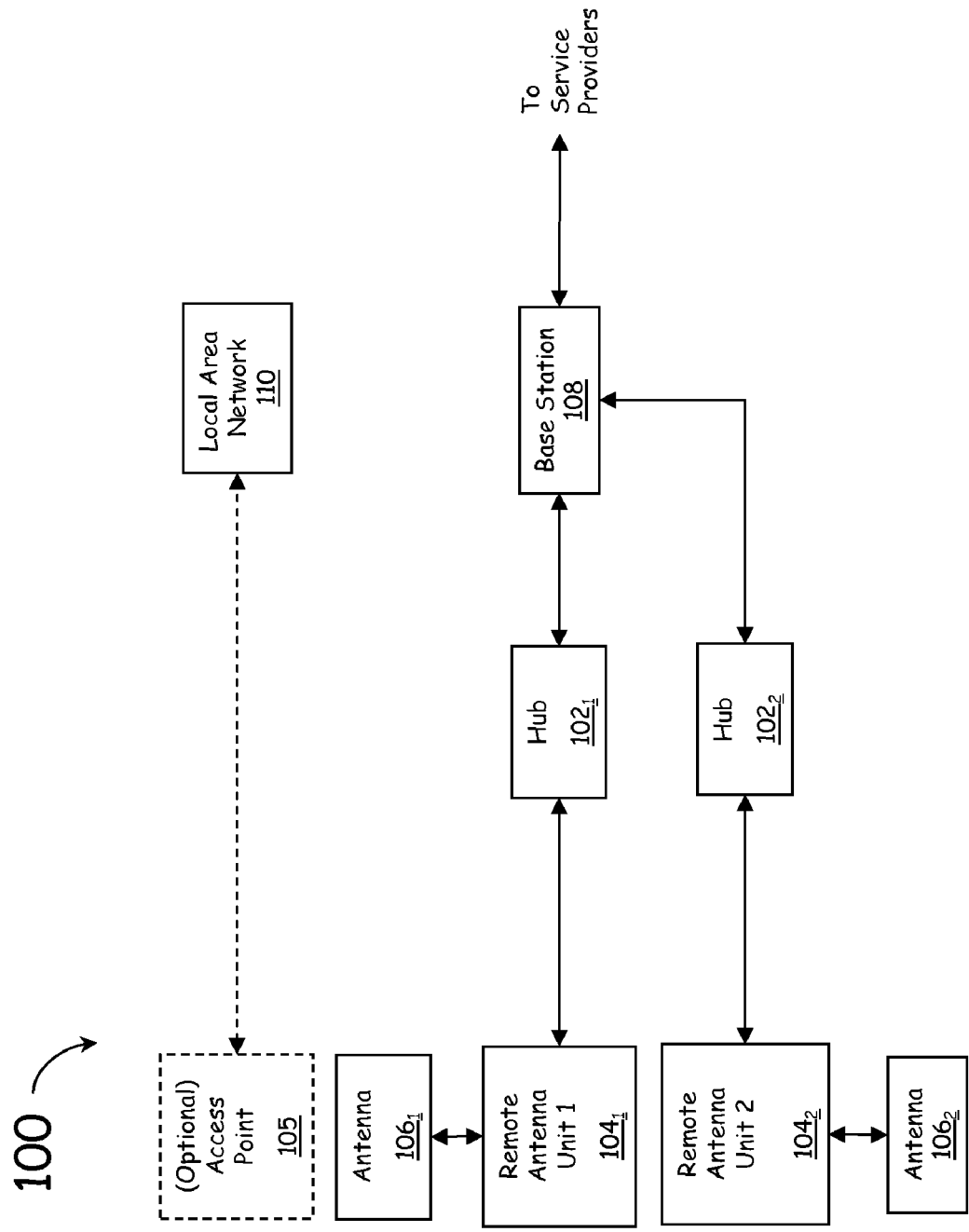
FIG. 1 is a block diagram of a conventional system having electronic components.

FIG. 1 is a block diagram of a conventional in-building distribution system 100 having electronic components for distributing wireless signals into structures that attenuate radio signals from one or more wireless service providers. The system 100 comprises remote antenna units $104_1$ and $104_2$ communicatively coupled to hubs $102_1$ and $102_2$, respectively. In one implementation, the hubs $102_1$ and $102_2$ are in operative communications with a single or multi-band wireless communications system for interior or exterior operation in public and private venues. In one embodiment, the system 100 comprises one of the family of INTER-REACH products commercially available from LGC Wireless, an ADC Company, having a place of business in San Jose, Calif. It is understood that additional products similar to the INTERREACH products are suitable for use within the system 100.

In the example embodiment of FIG. 1, the system 100 is a distributed antenna system (DAS), and includes antennas $106_1$ and $106_2$, each in operative communications with the remote antenna units $104_1$ and $104_2$. For example, the hubs $102_1$ and $102_2$ communicate with a base station 108 and pass signals to and from the remote antenna units $104_1$ and $104_2$. In one implementation, the system 100 includes an optional access point 105 in operative communication with a local area network 110 within the system 100. It is understood that in other embodiments, the system 100 is capable of accommodating any appropriate number of hubs 102, remote antenna units 104, access points 105, and antennas 106 in a single system 100. For example, in one embodiment, at least one of the remote antenna units 104 can be replaced with the access point 105 or other wireless communication device that is suitable for installation in an electronics enclosure for suspended ceilings. In this example, the access point 105 comprises an access point that conforms to one of the IEEE 802.11 standards.

Figure 2A:
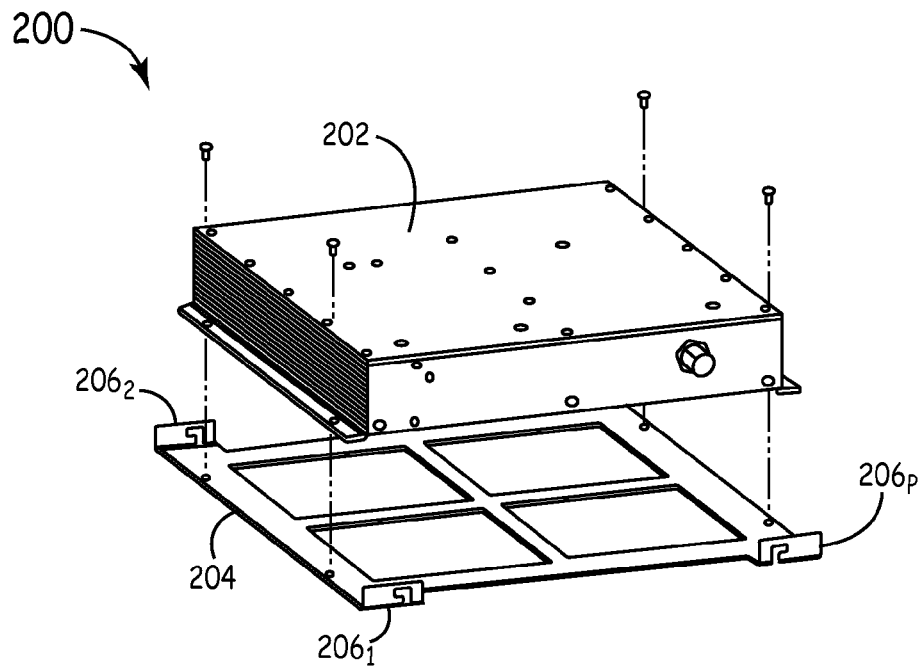
FIGS. 2A and 2B are perspective views of an embodiment of an electronics component and a mounting plate for an electronics enclosure for suspended ceilings.
Figure 2B:
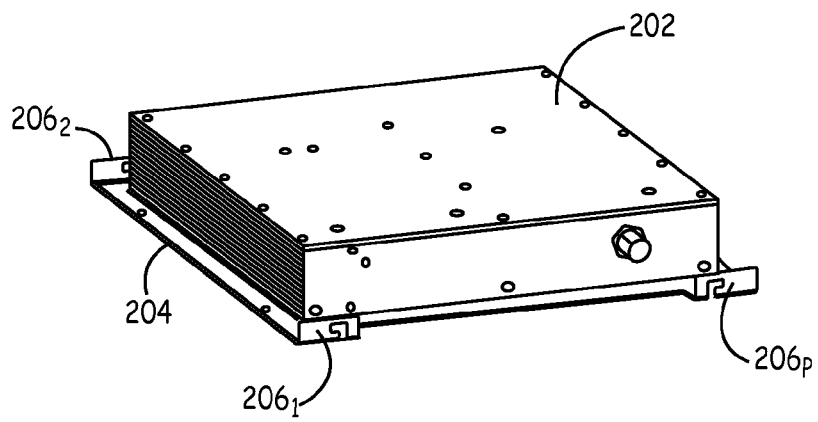

FIGS. 2A and 2B are perspective views of an electronics component 200. In the example embodiments of FIGS. 2A and 2B, the electronics component is the remote antenna unit 104 of FIG. 1. The electronics component shown in FIG. 2A comprises a containment unit 202 having at least four sides, each of the four sides having an inner surface and an outer surface, and a mounting plate 204. The mounting plate 204 further comprises one or more brackets $206_1$ to $206_P$. The containment unit 202 is provided to house the remote antenna unit 104.

In one implementation, the mounting plate 204 is attached contiguous with the outer surface of one of the four sides of the containment unit 202. Moreover, the mounting plate 204 is operable to couple the electronics component (for example, the remote antenna unit 104) to a cabinet frame of an electronics enclosure for suspended ceilings, as further discussed below with respect to FIGS. 3A to 3C. In one embodiment, the mounting plate 204 is rotatably mounted from one or more pivot assemblies of the cabinet frame to place the containment unit 202 in a plurality of positions (for example, to access the remote antenna unit 104 when the enclosure is suspended above a ceiling). In a similar embodiment, the containment unit 202 is pivotally attached to the cabinet frame from at least one set of the brackets 206. In one implementation, the at least one set of brackets 206 provides for removal of both the containment unit 202 and the mounting plate 204 from the cabinet frame.

Figure 3D:
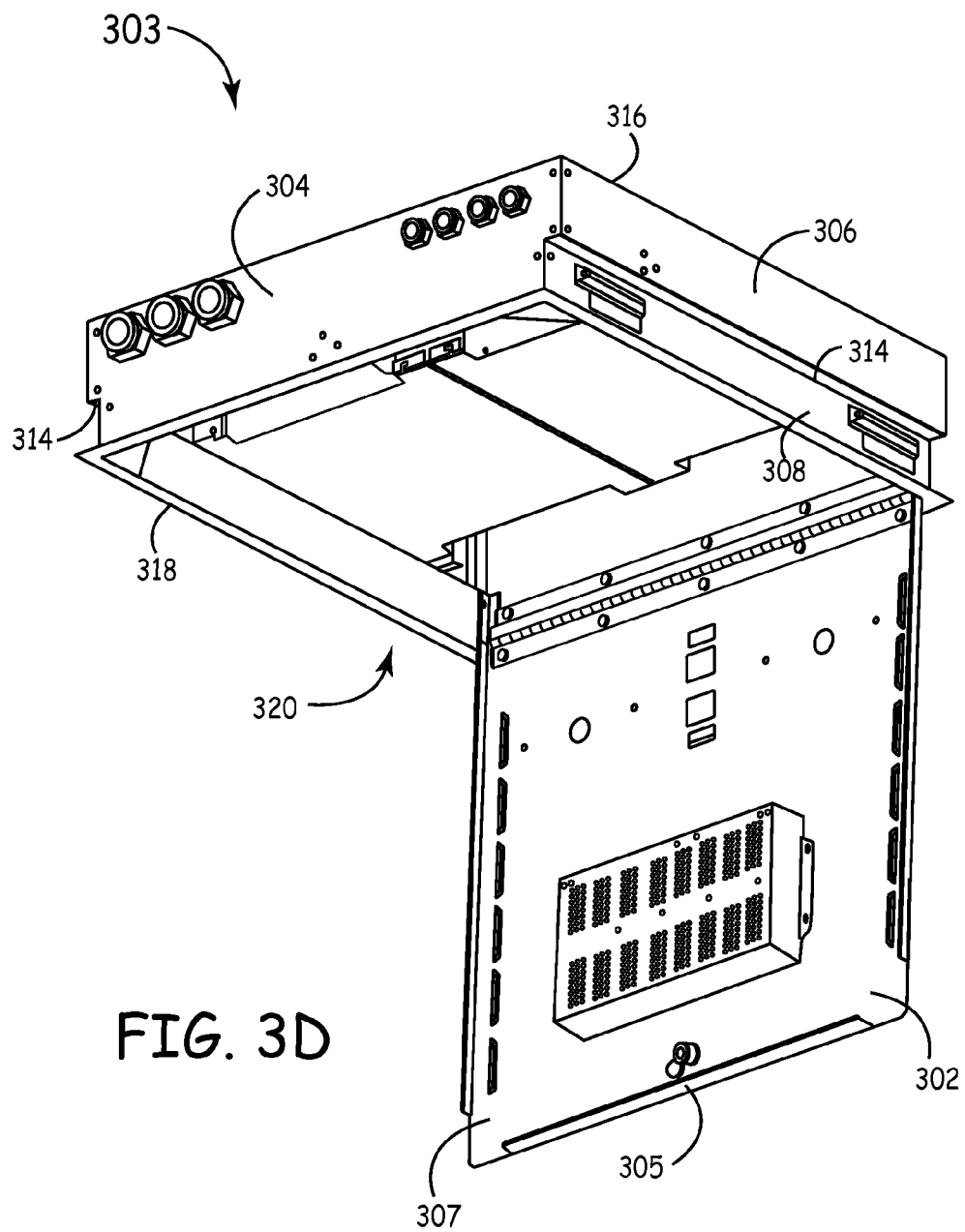
FIG. 3D is a perspective view of an embodiment of the assembled electronics enclosure for suspended ceilings.

FIGS. 3A and 3B are side elevational views, and FIG. 3C is a plan view of an embodiment of an electronics enclosure for suspended ceilings. FIG. 3D is a perspective view of an embodiment of an assembled electronics enclosure for suspended ceilings. In one embodiment, the electronics enclosure embodied by FIG. 3A and indicated generally by reference numeral 300 comprises a top plate 301, the base plate 302, and a cabinet frame 303. The cabinet frame 303 further comprises at least one side 304 and side portions 306 and 308 of at least one additional side similar to the side 304. The cabinet frame 303, comprising at least the one side 304 and the side portions 306 and 308 of the at least one additional side define a volume for housing electronic components. The cabinet frame 303 further comprises a top end 316 and a bottom end 318, as shown in FIG. 3D. The base plate 302 is pivotally coupled to the bottom end 318 of the cabinet frame 303 at an opposing end from the top plate 301. The base plate 302 has a lower surface 305 and an upper surface 307 and covers an opening 320 in the cabinet frame 303 as shown in FIG. 3D.

As discussed in further detail below with respect to FIG. 4, at least one side of frame 303 comprises first and second side portions 306 and 308. In one embodiment, the first portion 306 is offset from the second portion 308 by a prescribed amount with an adjoining flange (embodied in FIG. 3B and FIG. 3D as a flange 314) that perpendicularly engages a bottom edge of the first portion 306 and a top edge of the second portion 308. In this manner, the second portion 308 is being displaced laterally from the first portion 306 to define a volume larger in at least one dimension in the cabinet frame 303 above a junction of the first and second portions 306 and 308, as further exemplified in FIG. 3D.

The base plate 302 of FIG. 3C further comprises one or more external component apertures (for example, apertures $310_1$ and $310_2$ and aperture grouping 312). In one embodiment, the apertures $310_1$, $310_2$ and 312 provide communicative access for one or more electronics components external to the outer (lower) surface of the base plate 302 (for example, in one embodiment, the antennas 106 of FIG. 1 can be mounted external to the lower surface of the base plate 302 when the enclosure is mounted as shown in FIG. 4).

Figure 4:
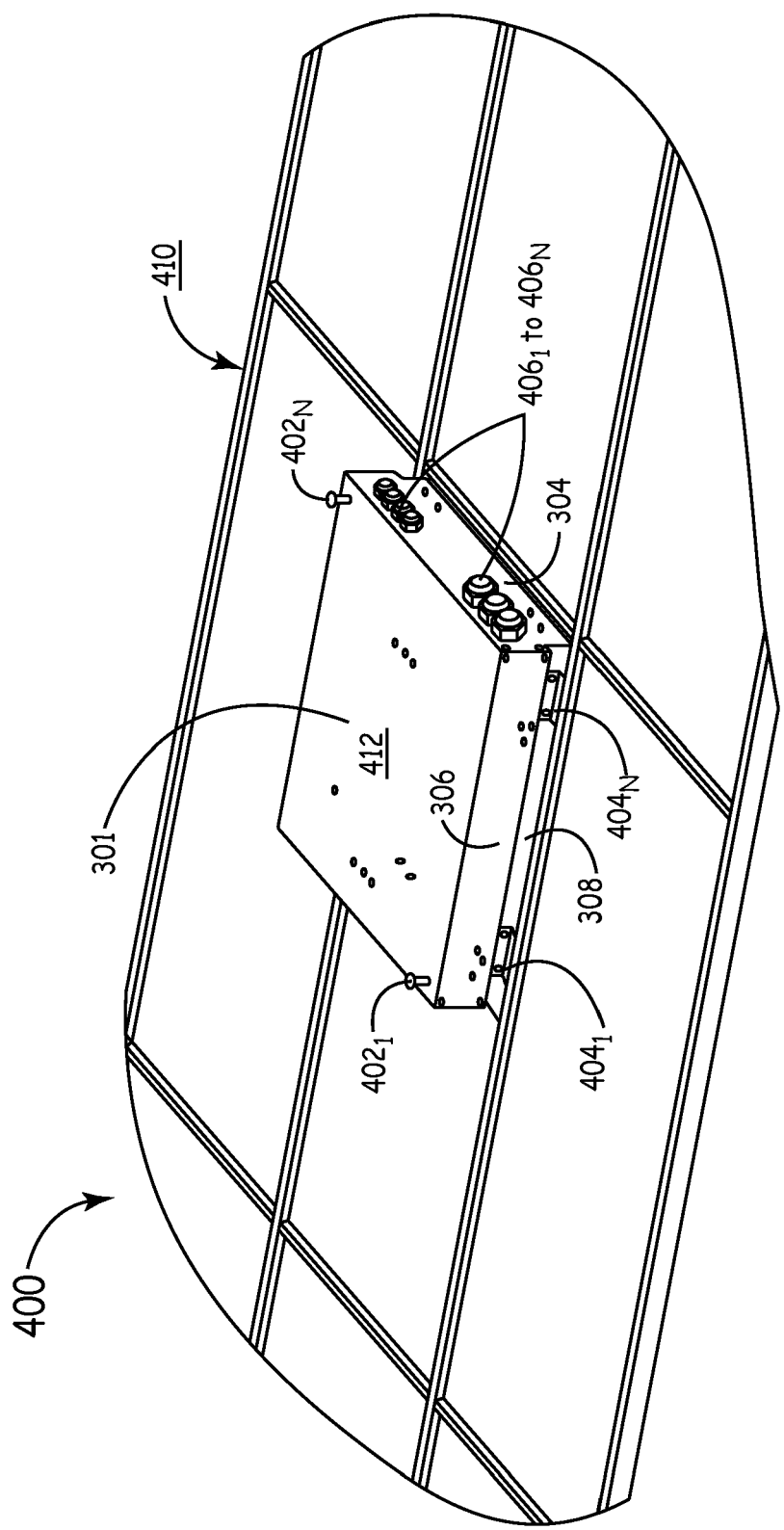
FIG. 4 is a perspective view of an embodiment of an electronics enclosure for a particular suspended ceiling viewed from above the suspending ceiling.

FIG. 4 is a perspective view of an embodiment of an electronics enclosure 412 for a particular suspended ceiling viewed from above the ceiling. In the example embodiment of FIG. 4, the suspended ceiling is represented by a suspended ceiling grid 410. The enclosure 412 shown in FIG. 4 comprises similar elements to the electronics enclosure depicted in FIGS. 3A to 3C, including the top plate 301, the at least one side 304 and the side portions 306 and 308. In the example embodiment of FIG. 4, the enclosure 412 includes cable access connectors $406_1$ to $406_N$ within the at least one side 304. The enclosure 412 further comprises one or more safety clamps 404 externally coupled to the side portion 308 of the cabinet frame for the enclosure 412. For example, the safety clamps $404_1$ to $404_N$ are operable to secure the mounting of the enclosure 412 above the suspended ceiling grid 410. In one embodiment, the enclosure 412 further comprises one or more safety hangers 402 (for example, safety hangers $402_1$ to $402_N$) externally coupled to the top plate 301 for additional secure placement of the electronics enclosure above the suspended ceiling grid 410.

Figure 5:
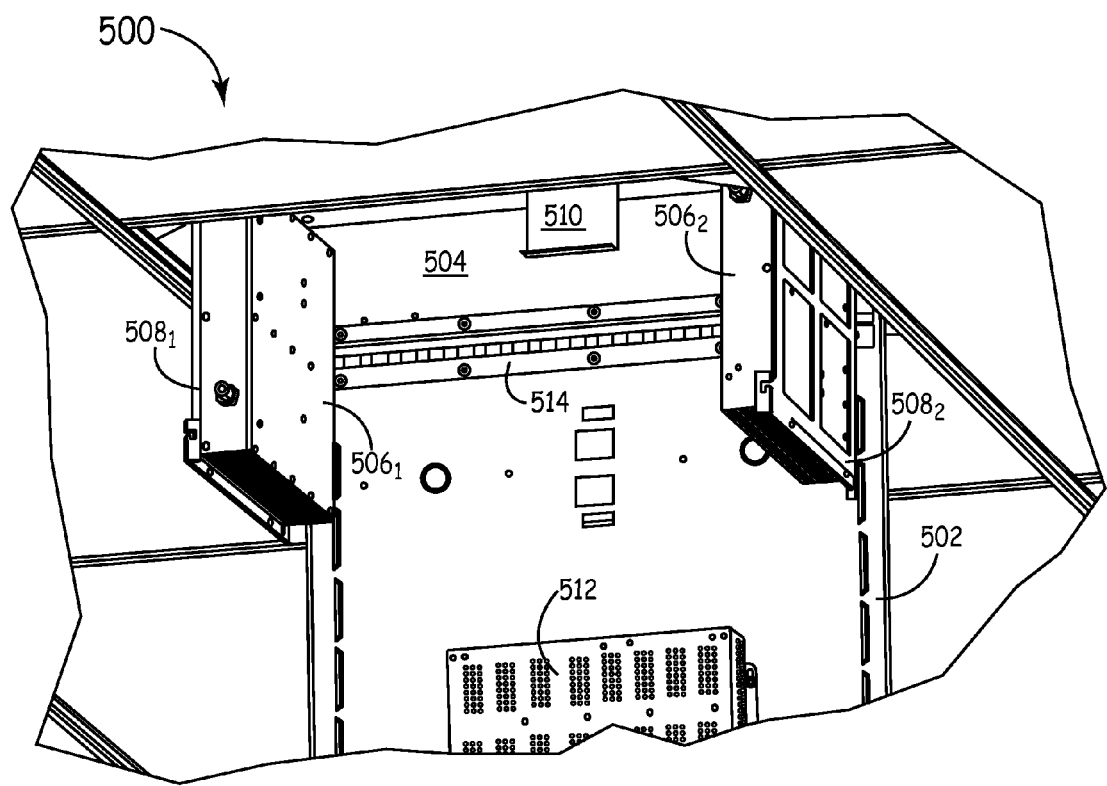
FIG. 5 is a perspective view of an embodiment of an electronics enclosure for a particular suspended ceiling viewed from below the suspending ceiling with a base plate open to provide access to electronic components inside the enclosure.

FIG. 5 is a perspective view of an embodiment of an electronics enclosure for a particular suspended ceiling viewed from below the suspending ceiling with a base plate 502 open to provide access to electronic components inside the enclosure. The base plate 502 is coupled to a particular cabinet frame side 504 with a hinge assembly 514. As shown in FIG. 5, at least one optional electronics component 512 (for example, an access point similar to the access point 105 of FIG. 1) is mounted to an upper surface of the base plate 502. In one embodiment, one or more mounting points are provided on the base plate 502 for attachment of the electronics component 512 to the base plate 502.

The electronics components $506_1$ and $506_2$ are pivotally attached to a cabinet frame of the electronics enclosure depicted in FIG. 5 by mounting plates $508_1$ and $508_2$, respectively. As further discussed below with respect to FIGS. 6A to 6D, the mounting plates $508_1$ and $508_2$ use one or more mounting brackets to attach the electronics components $506_1$ and $506_2$ to the cabinet frame of the electronics enclosure. The cabinet frame of FIG. 5 further comprises at least one pair of component retainer assemblies 510. The at least one pair of component retainer assemblies 510 is operable to securely dispose the electronics components $506_1$ and $506_2$ within the electronics enclosure of FIG. 5.

For example, when the electronics enclosure is opened, the electronics components $506_1$ and $506_2$ can be suspended from the electronics enclosure as shown in FIG. 5. This allows easy access to the electronic components $506_1$ and $506_2$ so that they can be replaced or repaired more easily. As discussed above with respect to FIGS. 3A to 3D, the cabinet frame of FIG. 5 is sized to receive electronics components $506_1$ and $506_2$ in a space that is wider in at least one dimension than the ceiling tile that is replaced by the electronics enclosure 500.

FIGS. 6A to 6D are perspective views of an electronics enclosure for suspended ceilings during installation of an electronic component (for example, the enclosure depicted in FIGS. 4 and 5 having the cabinet frame components depicted in FIGS. 3A to 3D). The cabinet frame depicted in FIGS. 6A to 6D provides for installation of the pair of electronics component $506$, along with any necessary spacing, that exceeds the tile dimensions of the particular suspended ceiling hosting the electronics enclosure. In the example embodiment of FIG. 6A, the cabinet frame for the electronics enclosure comprises the base plate $502$, the at least one side $504$, a side portion $606$, and at least one pair of component retainer assemblies $510$. Moreover, the cabinet frame for the electronics enclosure shown in FIG. 6D comprises the mounting plate $508_1$ having one or more component brackets $602_1$ to $602_M$. The mounting plate $508_1$ is contiguously secured to an outer surface of the at least one electronics component $506_1$. As further illustrated below with respect to the description of FIGS. 7A to 7D, the mounting plate $508_1$ is pivotally attached to the cabinet frame with one or more pivot assemblies $604$ (for example, the pivot assembly $604_1$). The pair of component retainer assemblies $510$ is coupled to the cabinet frame at a fixed planar distance from the one or more pivot assemblies $604$. As further illustrated below with respect to the description of FIGS. 8A to 8D, the pair of component retainer assemblies $510$ are operable to securely dispose at least the electronics component $506_1$ within the electronics enclosure.

Figure 6A:
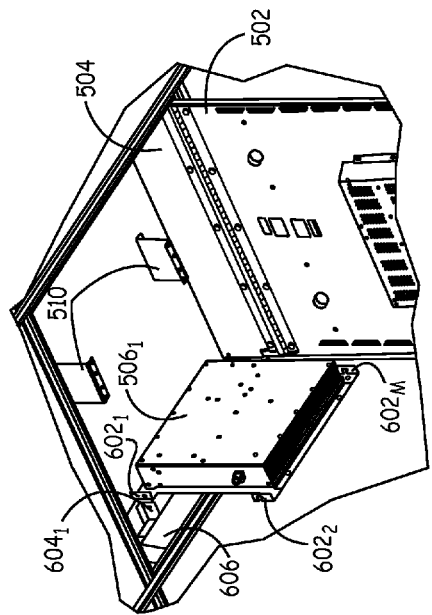
FIGS. 6A to 6D are perspective views of an electronics enclosure for suspended ceilings during installation of an electronic component.
Figure 6B:
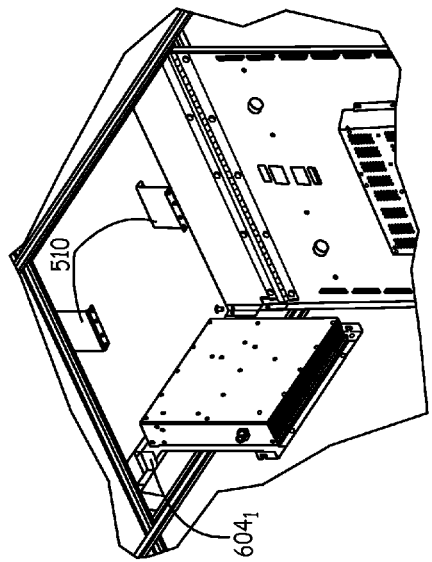
Figure 6C:
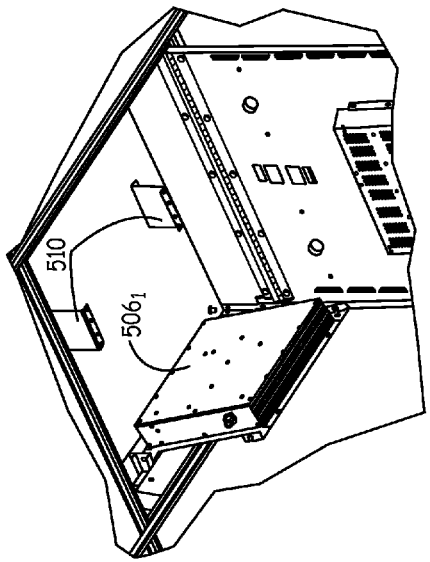
Figure 6D:
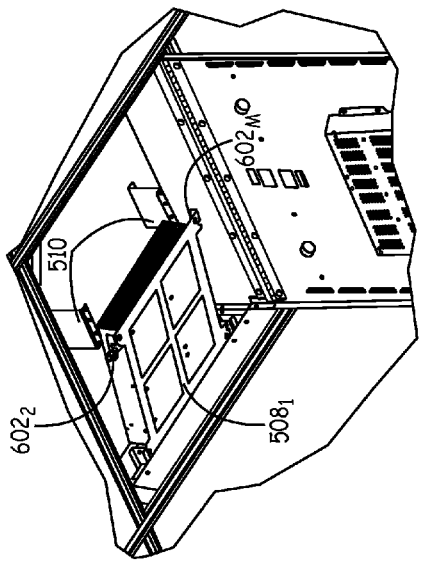

In operation, the electronics enclosure of FIGS. 6A to 6D provide easy access to the electronic component $506_1$ to enable simplified maintenance of the electronic components in the electronics enclosure. For example, to remove an electronic component $506_1$ from the enclosure, the mounting plate $508_1$ is opened as shown in FIG. 6D. The mounting plate $508_1$ is dislodged from the retainer assemblies $510$ so that the mounting plate $508_1$ is enabled to pivot at the pivot assembly $604_1$ as shown in sequential images in FIGS. 6D, 6C and 6B. At the end of its rotation, the mounting plate $508_1$ and the electronic component $506_1$ extend in a vertical direction from the electronics enclosure. In this position, a technician can easily make any repairs to electronic component $506_1$ including removal of the electronic component $506_1$.

Once the repair is complete or a new electronic component $506_1$ is installed, the technician pivots the electronic component $506_1$ and the mounting plate $508_1$ back into position in the enclosure as shown by the sequence of images in FIGS. 6B, 6C, and 6D. The mounting plate $508_1$ engages the retainer assemblies $510$ and the base plate $502$ is closed.

FIGS. 7A to 7D are perspective views of an electronics enclosure for suspended ceilings during installation of an electronics component (for example, the electronics enclosure depicted in FIGS. 4 and 5 having the cabinet frame components depicted in FIGS. 3A to 3D). For example, the perspective views provided by FIGS. 7A to 7D are shown as downward views from the top portion $316$ of FIG. 3D. The cabinet frame portion depicted in FIGS. 7A to 7D comprises first and second portions $704$ and $706$. The first portion $704$ is offset from the second portion $706$ by a prescribed amount with an adjoining flange $708$ that perpendicularly engages a bottom edge of the first portion $704$ and a top edge of the second portion $708$. In one embodiment, the one or more pivot assemblies $604$ depicted in FIGS. 6A to 6D attach to the first portion $704$ of the cabinet frame.

As shown by the operative progression from FIG. 7A to FIG. 7D, the mounting plate $508_1$ is pivotally attached to the cabinet frame using the pivot assembly $604_2$. In one embodiment, the component bracket $602_2$ of the mounting plate $508_1$ pivotally attaches the electronics component $506_1$ to the cabinet frame with a pivot point $702$ inserted through an aperture $710$ of the component bracket $602_2$. Moreover, the pivot assembly $604_2$ is located at a point such that a back surface of the mounting plate $508_1$ fits within the cabinet frame of the electronics enclosure when the electronics component $506_1$ and the mounting plate $508_1$ are rotated upwards.

Figure 7A:
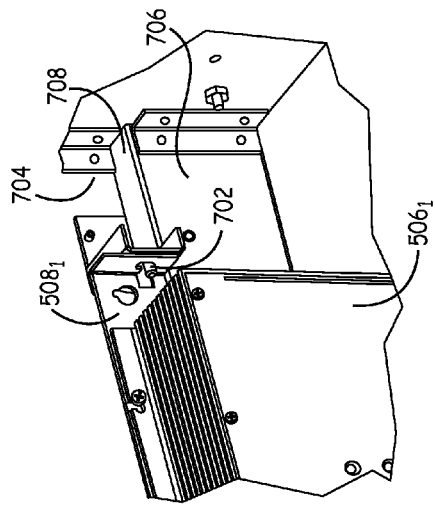
FIGS. 7A to 7D are perspective views of an electronics enclosure for suspended ceilings during installation of an electronic component.
Figure 7B:
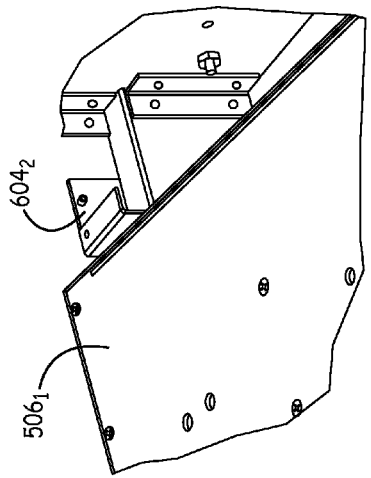
Figure 7C:
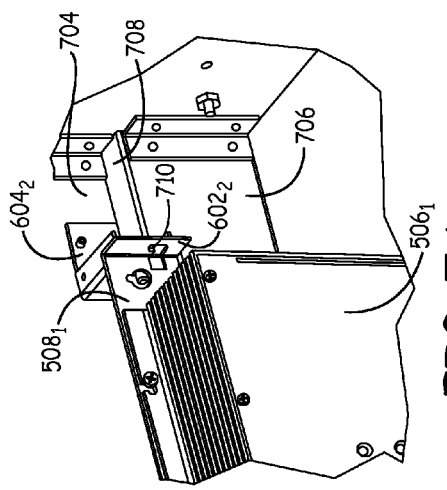
Figure 7D:
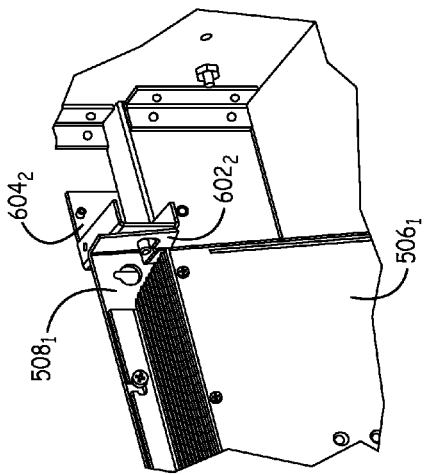
Figure 8A:
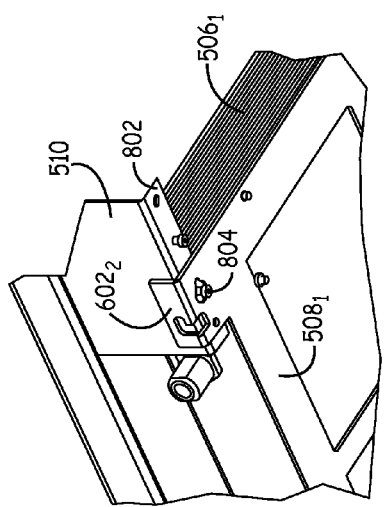
FIGS. 8A to 8D are perspective views of an electronics enclosure for suspended ceilings during installation of an electronic component.
Figure 8B:
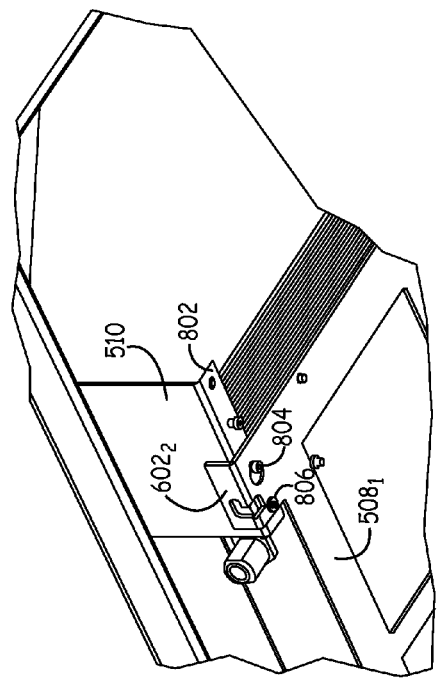
Figure 8C:
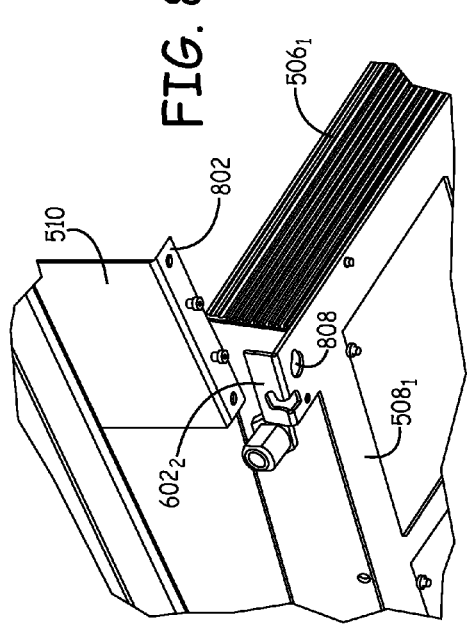
Figure 8D:
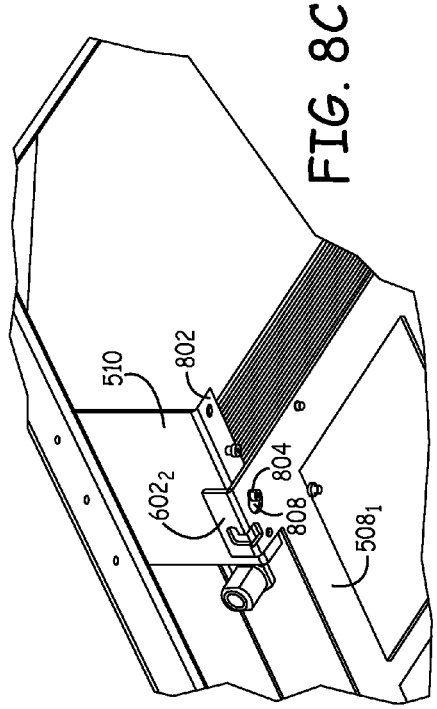

The pivot assembly $604_2$ provides for placement of the at least one electronics component $506_1$ in a plurality of positions when the enclosure is suspended above a ceiling. For example, FIG. 7A illustrates the electronics component $506_1$ vertically suspended in a first position using the pivot assembly $604_2$. From FIGS. 7B to 7D, the electronics component $506_1$ rotates to a second, near horizontal position. In this manner, the at least one electronics component $506_1$ is at least partially disposed within the cabinet frame.

FIGS. 8A to 8D are perspective views of an electronics enclosure for suspended ceilings during installation of an electronic component. As shown by the operative progression from FIG. 8A to FIG. 8D, the mounting plate $508_1$ is securely disposed within the electronics enclosure with the one or more component brackets $602$ of the mounting plate $508$ attached to the component retainer assembly $510$. In one embodiment, the component retainer assembly $510$ is coupled to the cabinet frame comprising the electronics enclosure $412$ of FIG. 4 at a fixed planar distance from the one or more pivot assemblies $604$ (as described above with respect to FIGS. 7A to 7D). In the illustrative embodiments of FIGS. 8B and 8C, as the mounting plate $508$, rotatably engages with the component retainer assembly $510$, the component bracket $6022$ comprises an aperture $808$ configured for insertion of a first fastener $804$. The first fastener $804$ is securely fastened to a flange portion $802$ of the component retainer assembly $510$. As the electronics component $506_1$ is rotatably engaged into a locking position in the example embodiment of FIG. 8D, the mounting plate $508_1$ is further secured to a flange portion $802$ of the component retainer assembly $510$ by a second fastener $806$. It is understood that the first and second fasteners $804$ and $806$ depict a plurality of fastening attachments (for example, screw-type fasteners, clip-type fasteners, adhesive-type fasteners, or the like).

Figure 9:
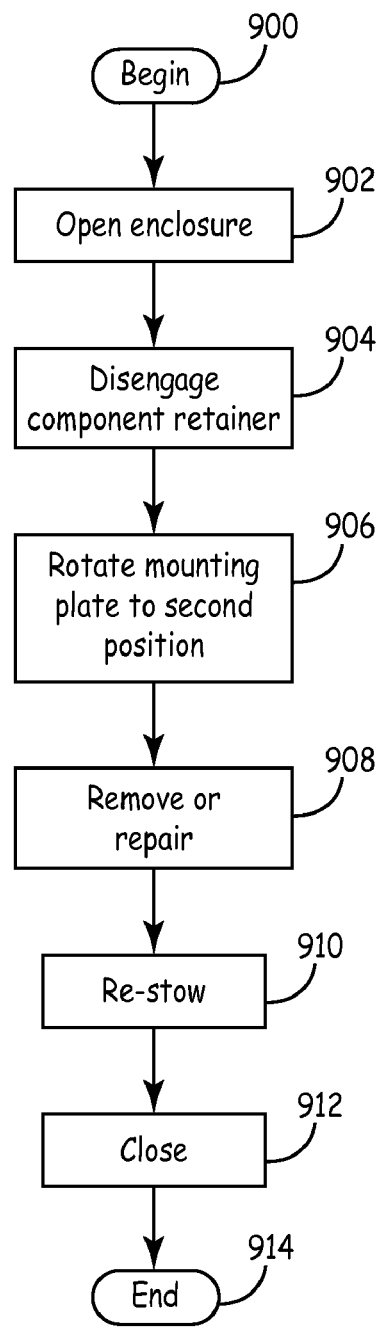
FIG. 9 is a flow diagram illustrating an embodiment of a method of servicing electronic components in an electronics enclosure for suspended ceilings.

FIG. 9 is a flow diagram of a method of servicing electronic components in an electronics enclosure for suspended ceilings. The method addresses servicing one or more telecommunications networking components in an electronics enclosure similar to the enclosure $412$ of FIG. 4 using pivotally hinged access plates to allow for ease of service and (potential) upgrades or replacement of the one or more telecommunications networking components. In one implementation, the pivotally hinged access plates and the enclosure provide a method of installing and servicing electronic components in a housing having at least one dimension that is wider than a ceiling tile in the particular suspending ceiling. Moreover, at least one mounting plate of the electronics enclosure pivots from a first position wherein the at least one mounting plate is stored within a frame of the enclosure to a second position wherein the at least one mounting plate extends through the opening in the frame that is covered by a base plate.

In one implementation, the method provides access to electronic components securely mounted on mounting plates within an enclosure. The method begins at block $900$. At block $902$, a technician opens the enclosure (for example, base plate $502$ of FIG. 5). As shown in FIG. 6D, for example, the technician disengages component retainer assemblies at block $904$. This enables the mounting plate and electronic component to pivot between the first position and the second position (for example, as shown in FIGS. 6D, 6C and 6B) at block $906$. The electronic component is serviced at block $908$ (for example, removed or repaired). In one implementation, both the electronic component and at least one mounting plate holding the electronic component are replaceable. At block 910, the mounting plate is rotated back to the first position and the electronic component is re-stowed in the enclosure. At block 912, the base plate of the enclosure is closed and the method ends at block 914.

This description has been presented for purposes of illustration, and is not intended to be exhaustive or limited to the embodiments disclosed. The embodiments disclosed are intended to cover any modifications, adaptations or variations which fall within the scope of the following claims.

What is claimed is:

1. An electronics enclosure, comprising:
   a top plate;
   a cabinet frame coupled to the top plate, the cabinet frame having at least two sides;
   a base plate, pivotally coupled to the cabinet frame at an opposing end from the top plate, the base plate having an upper surface and a lower surface and covering an opening in the cabinet frame;
   at least one removable mounting plate, pivotally coupled inside the cabinet to one or more pivot assemblies, wherein a pivot point on the one or more pivot assemblies couples to a slot in a bracket on the at least one removable mounting plate, the at least one mounting plate for holding at least one electronic component within the cabinet frame between the base plate and the top plate; and
   wherein the at least one removable mounting plate rotates from a first position wherein the at least one removable mounting plate is stored within the cabinet frame to a second position wherein the at least one removable mounting plate extends through the opening in the cabinet frame that is covered by the base plate.

2. The enclosure of claim 1, wherein the at least two sides of the cabinet frame further comprise first and second portions, the first portion offset from the second portion by a prescribed amount with an adjoining flange that perpendicularly engages a bottom edge of the first portion and a top edge of the second portion.

3. The enclosure of claim 2, wherein the one or more pivot assemblies couple to the cabinet frame along the adjoining flange.

4. The enclosure of claim 1, wherein the at least one removable mounting plate is contiguous with an outer surface of the at least one electronic component.

5. The enclosure of claim 1, further comprising one or more external component apertures within the base plate.

6. The enclosure of claim 1, further comprising a pair of component retainer assemblies coupled to the top plate at a distance from one of the at least two sides of the cabinet frame, the pair of component retainer assemblies operable to secure the at least one removable mounting plate in the first position.

7. The enclosure of claim 1, further comprising an antenna for a wireless communications network access point mounted to the upper surface of the base plate.

8. An enclosure, comprising:
   a frame having a top end and a bottom end, the frame comprising:
      a plurality of sides defining a volume for housing electronic components;
      a removable mounting plate for holding at least one electronic component within the frame between the bottom end and the top end, the removable mounting plate pivotally coupled inside the frame to one or more pivot assemblies, wherein a pivot point on the one or more pivot assemblies couples to a slot in a bracket on the at least one removable mounting plate;
      at least one side of the plurality of sides having two portions, a first portion at the top end of the frame and a second portion at the bottom end of the frame, the first portion being displaced laterally from the second portion to define a volume larger in at least one dimension in the frame above a junction of the first and second portions; and
   a bottom plate, pivotally coupled to the bottom end of the frame.

9. The enclosure of claim 8, wherein the one or more pivot assemblies couple to the frame between the first and second portions, the one or more pivot assemblies operable to place the electronic components in a plurality of positions when the electronics enclosure is suspended above a ceiling.

10. The enclosure of claim 9, further comprising a pair of component retainer assemblies coupled to the frame at a distance from the one or more pivot assemblies, the pair of component retainer assemblies operable to securely dispose the electronic components within the enclosure.

11. A mounting system for an electronics enclosure, comprising:
    a cabinet frame for the electronics enclosure;
    a base plate on the cabinet frame, the base plate having an upper surface and a lower surface;
    a removable mounting plate for receiving at least one electronic component, the removable mounting plate pivotally attached to the cabinet frame with one or more pivot assemblies, wherein a pivot point on the one or more pivot assemblies couples to a slot in one or more component brackets on the removable mounting plate;
    a pair of component retainer assemblies coupled to the cabinet frame at a fixed planar distance from the one or more pivot assemblies, the pair of component retainer assemblies operable to securely dispose the at least one electronics component within the electronics enclosure; and
    wherein the at least one electronics component is rotatably mounted on the removable mounting plate, the removable mounting plate coupled to the one or more pivot assemblies of the cabinet frame to place the at least one electronics component in a plurality of positions when the electronics enclosure is suspended above a ceiling and the at least one electronics component is at least partially disposed within the cabinet frame.

12. The system of claim 11, further comprising:
    a top plate coupled to the cabinet frame at an opposing side from the base plate, the top plate having an upper surface and a lower surface; and
    one or more safety hangers externally coupled to the upper surface of the top plate, the one or more safety hangers operable for hanging the electronics enclosure above a suspended ceiling.

13. The system of claim 11, wherein at least one side of the cabinet frame further comprises two portions, a first portion at the bottom end of the cabinet frame and a second portion at the top end of the cabinet frame, the second portion being displaced laterally from the first portion to define a volume larger in at least one dimension in the cabinet frame above a junction of the first and second portions.

14. The system of claim 11, wherein the one or more component brackets provide for removal of the removable mounting plate and the at least one electronics component from the cabinet frame.

15. The system of claim 11, wherein the one or more component brackets are further operable to securely dispose the at least one electronics component within the enclosure using the pair of component retainer assemblies.

* * * * *